(12) United States Patent
Franz et al.

(10) Patent No.: US 8,202,047 B2
(45) Date of Patent: Jun. 19, 2012

(54) FAN MODULE LATCHING DEVICE

(75) Inventors: John P. Franz, Houston, TX (US); Belgie B. McClelland, Houston, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1078 days.

(21) Appl. No.: 12/116,601

(22) Filed: May 7, 2008

(65) Prior Publication Data

US 2008/0304234 A1 Dec. 11, 2008

Related U.S. Application Data

(60) Provisional application No. 60/942,499, filed on Jun. 7, 2007.

(51) Int. Cl.
  *F04D 29/60* (2006.01)
(52) U.S. Cl. .................... 415/213.1; 415/126
(58) Field of Classification Search ................. 415/126, 415/213.1, 220; 165/122; 361/695
  See application file for complete search history.

(56) References Cited

U.S. PATENT DOCUMENTS

| | | | |
|---|---|---|---|
| 6,075,698 A | 6/2000 | Hogan et al. | |
| 6,222,736 B1 * | 4/2001 | Sim et al. | 361/727 |
| 6,435,889 B1 * | 8/2002 | Vinson et al. | 439/247 |
| 6,525,941 B1 | 2/2003 | Lai | |
| 6,556,437 B1 * | 4/2003 | Hardin | 361/679.48 |
| 6,587,342 B1 | 7/2003 | Hsu | |
| 6,795,314 B1 | 9/2004 | Arbogast et al. | |
| 6,878,874 B2 | 4/2005 | Osborn et al. | |
| 6,896,611 B2 | 5/2005 | Giraldo et al. | |
| 7,009,841 B2 | 3/2006 | Chen et al. | |
| 7,116,238 B2 | 10/2006 | Nishimura et al. | |
| 7,243,709 B2 | 7/2007 | Chen et al. | |
| 7,558,061 B2 * | 7/2009 | Franz et al. | 361/695 |
| 2006/0099092 A1 | 5/2006 | Lu et al. | |
| 2007/0017163 A1 | 1/2007 | Silberman et al. | |
| 2007/0035923 A1 | 2/2007 | Beall et al. | |
| 2007/0064385 A1 | 3/2007 | Paul et al. | |

* cited by examiner

*Primary Examiner* — Ninh H Nguyen

(57) ABSTRACT

A fan module latching device includes a bezel, a base adapted for enclosing a fan, and a handle assembly rotatably retained between the bezel and the base. The handle assembly has a rearwardly depending cam member and a frontwardly extending handle for actuating the handle assembly between a neutral position and an actuated position. A module latch, attached to the base, includes a cam follower and at least one latching tab, the cam follower engaging the cam member such that when the handle assembly is in the neutral position the latching tab is extended outwardly with respect to the base and when the handle assembly is in the actuated position the latching tab is retracted inwardly with respect to the base.

20 Claims, 7 Drawing Sheets

FAN MODULE LATCHING DEVICE

CROSS-REFERENCE TO RELATED APPLICATIONS

This application claims priority of U.S. Provisional Application No. 60/942,499, filed Jun. 7, 2007, entitled "Twist Actuated Module Handle."

BACKGROUND

Fan modules including fans are often used as part of a cooling system to provide air flow to an electronics enclosure by circulating air from outside through the enclosure. Such fan modules are typically mounted inside the enclosure with an front face of the fan exposed to the space outside the enclosure through an opening in the enclosure. A fan module must be secured to the enclosure to prevent the fan module from coming lose during shipment or operation, due to vibration or other mechanical forces. Accordingly, a fan module can be secured in an enclosure using various mechanical devices.

When a fan module fails or requires maintenance, it must removed from the enclosure. However, mechanisms in the prior art for removably securing a fan module in an enclosure have disadvantages. In some systems, the fan module is secured in the enclosure so that it must be removed from inside the enclosure rather than from the outside, which may require powering down the electronics in the enclosure. In other systems, the fan module is secured in the enclosure using hardware manipulated by a tool such as a screwdriver. In still other systems, a mechanism for securing the fan module within the enclosure may impeded air flow to the fan.

BRIEF DESCRIPTION OF THE DRAWINGS

The accompanying drawings illustrate embodiments of a fan module latching device described herein.

In the drawings.

DETAILED DESCRIPTION

Figure 1:
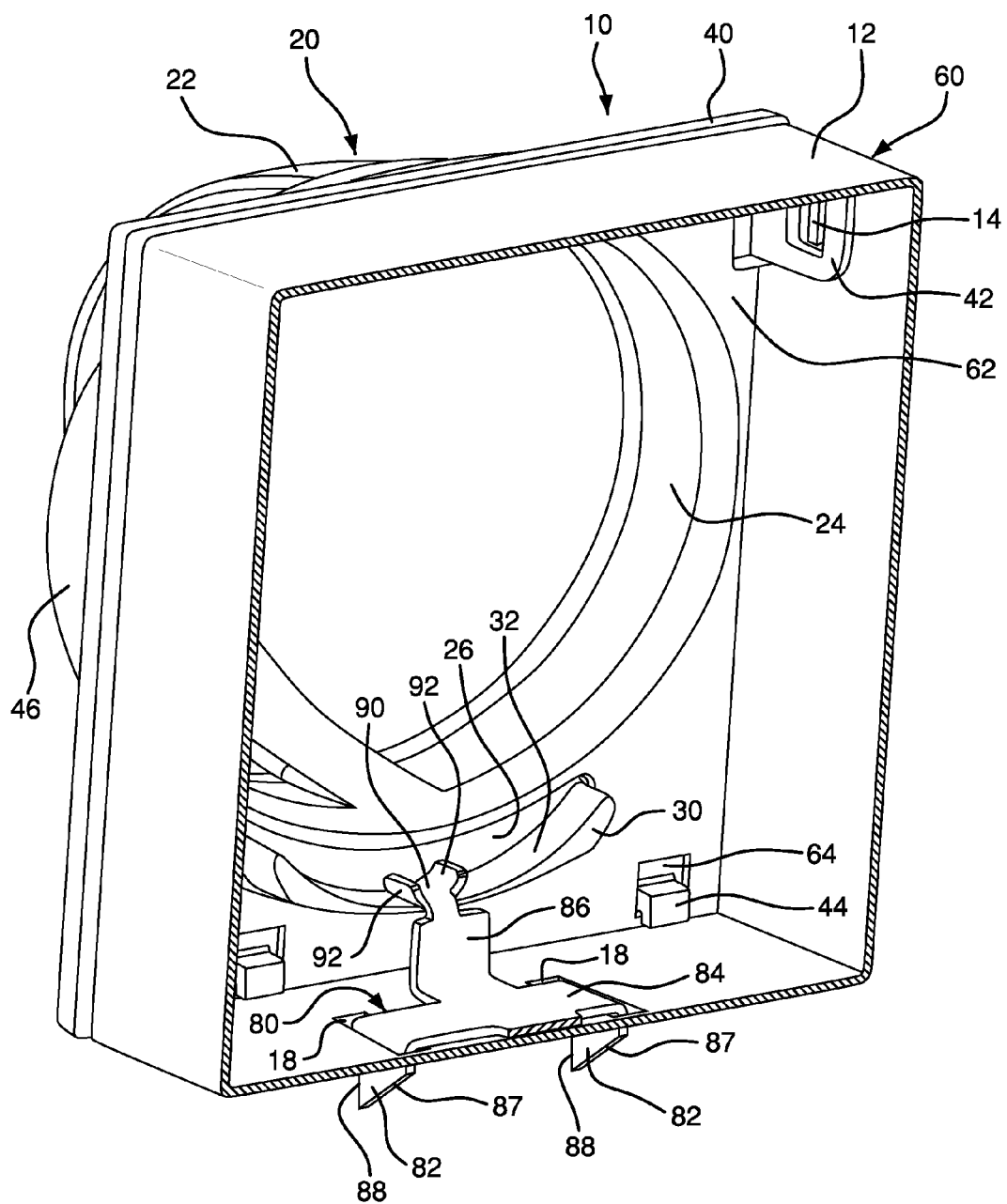
FIG. 1 is a cutaway rear perspective view showing an embodiment of a fan module latching device.
Figure 2:
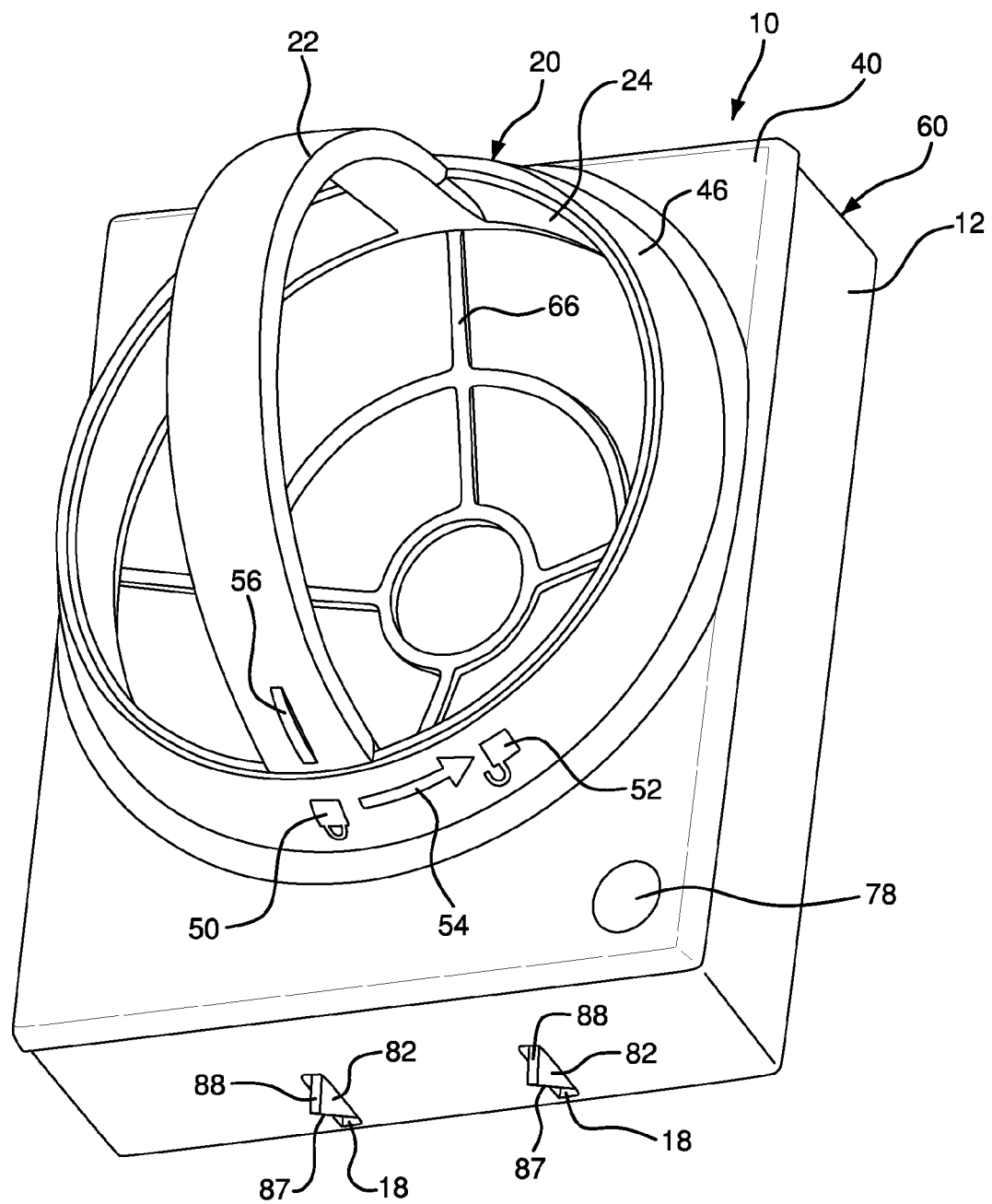
FIG. 2 is a front perspective view showing the fan module latching device of FIG. 1.
Figure 7:
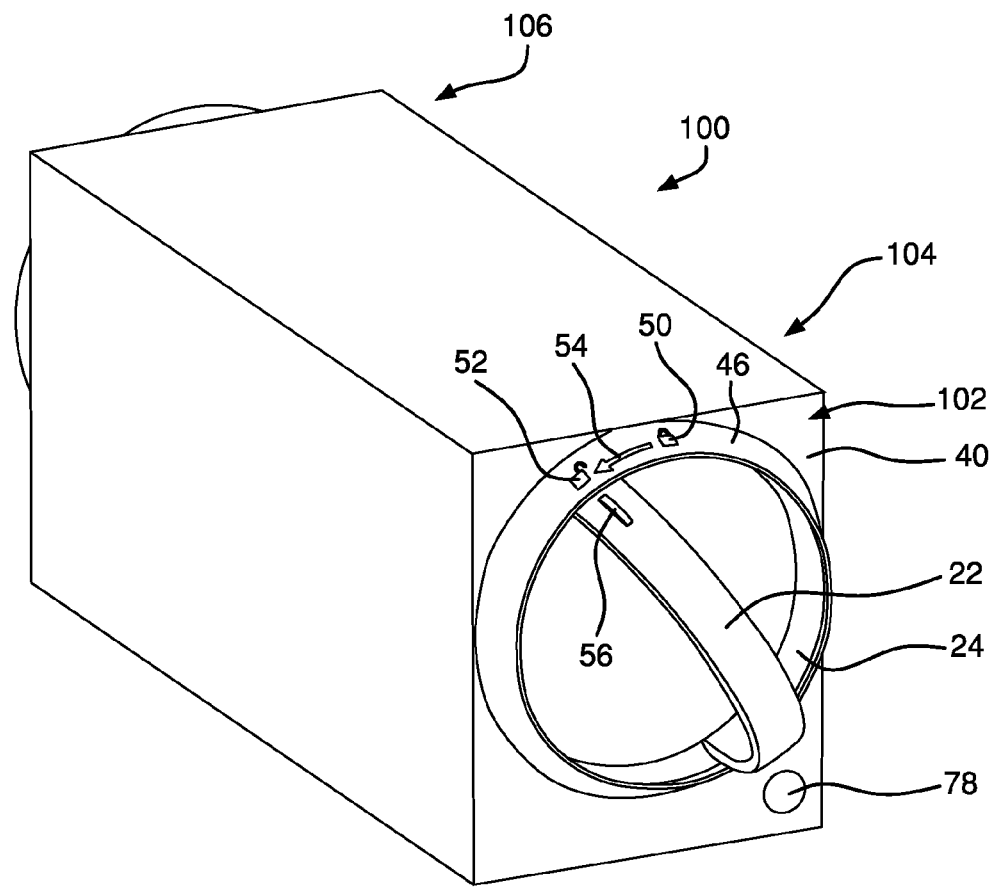
FIG. 7 is a front perspective view of a fan module including an embodiment of a fan module latching device.
Figure 8:
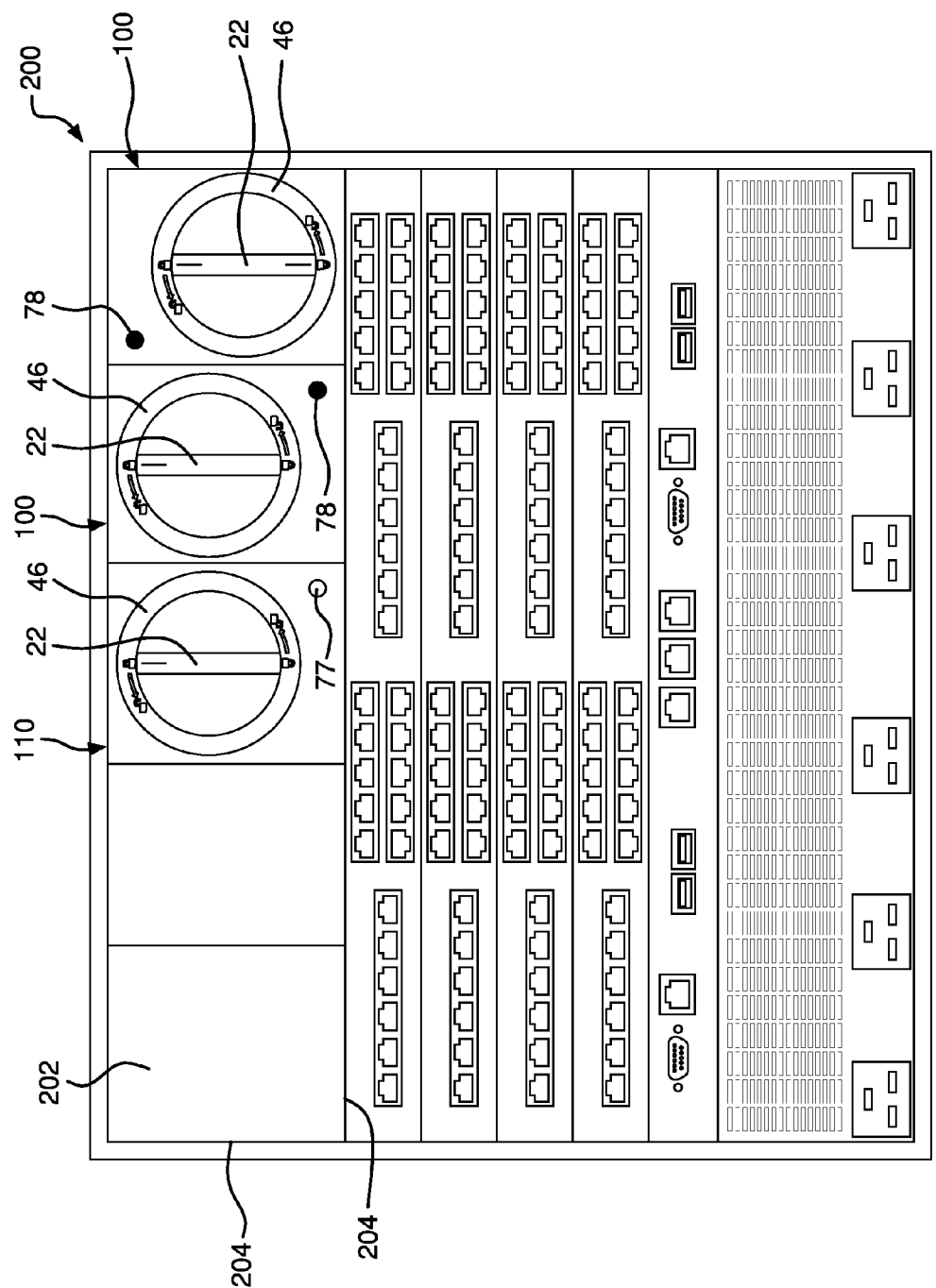
FIG. 8 is a front view of a bank of fan modules and blank modules, each module including an embodiment of a fan module latching device.

There is shown in FIGS. 1 and 2 an embodiment of a fan module latching device 10 for removably securing a fan module in an enclosure. An exemplary fan module 100 is shown in FIG. 7 and exemplary fan modules 100 and blank modules 110 mounted in an enclosure 200 are shown in FIG. 8. In describing the latching device 10 and the fan module 100, the terms "front" and "frontward" and the like indicate a direction facing outwardly from an enclosure 200 when the fan module 100 is installed therein, and the terms "rear" and "rearward" and the like indicate a direction facing inwardly toward the enclosure 200 when the fan module 100 is installed therein. Accordingly, the fan module 100 has a front face 102, a front portion 104, and a rear portion 106, as shown in FIG. 7.

The fan module 100 is sized to fit within a corresponding opening 202 within an enclosure 200, the rear portion 106 of the fan module 100 being inserted into the enclosure 200 and the face 102 the fan module 100 facing outwardly from the enclosure 200. The enclosure opening 202 is bounded by one or more edges 204. As illustrated in FIG. 8, a fan module 100 can be mounted such that the face 102 is turned in any orientation within respect to the enclosure 200 without impacting the usability of the latching device 10. Although the depicted embodiments show the fan module 100 having a generally square face 102, the fan module 100 can have other geometric shapes, including but not limited to generally rectangular and generally circular.

Figure 5:
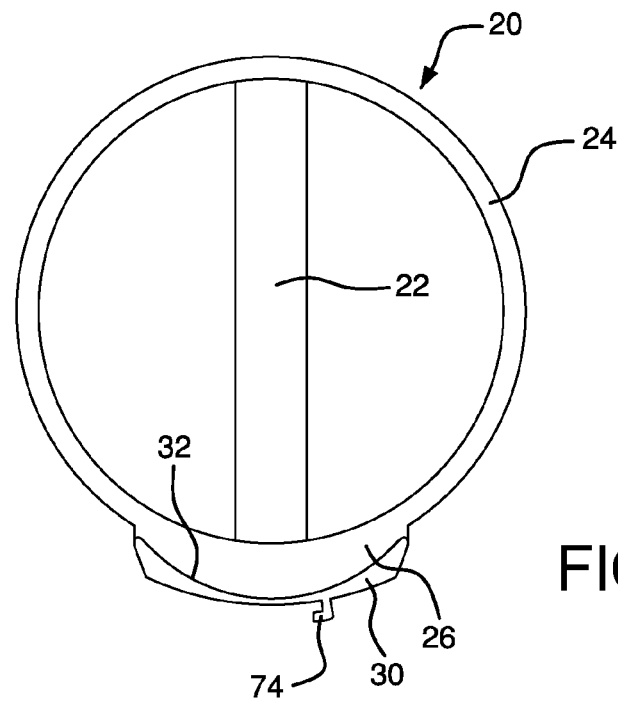
FIG. 5 is a rear view showing a handle assembly for use in an embodiment of a fan module latching device.

The latching device 10 comprises a handle assembly 20, a bezel 40, and a base 60. The handle assembly 20, as shown in detail FIG. 5, comprises a rearwardly depending annular skirt 24, a handle 22 extending in a forward direction from the skirt 24, and a cam member 30 extending in a rearward direction from the skirt 24. The skirt 24 interconnects between the handle 22 and the cam member 30. In the depicted embodiment, a member 26 depends from the skirt 24 and the cam member 30 extends rearwardly from the member 26. The cam member 30 comprises a cam surface 32.

The handle assembly 20 is rotatably supported by the base 60 and the bezel 40, and is retained therebetween, such that the handle assembly 20 can rotate back and forth with respect to the base 60 between a neutral position and an actuated position. As shown in FIG. 2, the bezel 40 comprises a trim ring 46 having a locked indicator 50, an unlocked indicator 52, and a directional arrow 54 indicating the direction in which the handle assembly 20 should be turned to unlock the fan module 100 from the enclosure 200. In one embodiment, the handle 22 includes a mark 58 that can be aligned with the indicators 50, 52. Accordingly, the neutral position is indicated by the mark 58 being aligned with the locked indicator 50 and the actuated position is indicated by the mark 58 being aligned with the unlocked indicator 52. In one embodiment, a rotational distance of about 30 degrees separates the locked indicator 50 from the unlocked indicator 52.

In the embodiments depicted in FIGS. 1-3 and 7-8, the handle 22 is a generally U-shaped handle affixed to the skirt 24 at diametrically opposed locations. The handle 22 is adapted to be grasped by a user to rotate the handle assembly 20 with respect to the base 60, to disengage the fan module 100 from the enclosure 200. The handle 22 is further adapted to be grasped by a user to pull the fan module 100 frontwardly out from the enclosure 200. Rotation and pulling of the handle 22 can be performed sequentially or simultaneously. Performing the concurrent combination of twisting and pulling actions facilitates removal of the module 100 from an enclosure 200. Additionally, the handle 22 has a narrow profile that is aesthetically pleasing and does not impeded air flow to or from the fan.

Figure 6:
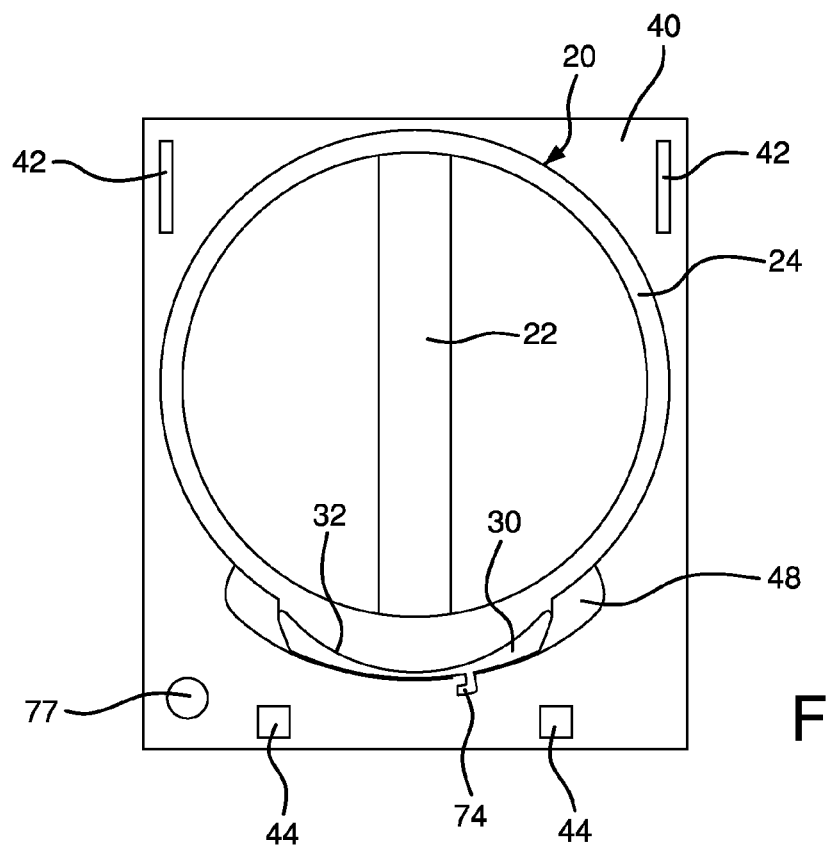
FIG. 6 is a rear view showing a handle assembly mounted to a bezel for use in an embodiment of a fan module latching device.

The handle assembly 20 fits together with the bezel 40 as depicted in FIG. 6. The skirt 24 extends rearwardly from the bezel 40, the bezel 40 including a recess 48 to enable the plate 26 and the cam member 30 to rotate freely with respect to the bezel 40. The handle 22 extends frontwardly, from the bezel 40. As depicted in FIG. 2, the bezel 40 further comprises a trim ring 46 extending frontwardly therefrom to aid in retaining the handle assembly 20, to provide rigidity to the bezel 40, and to provide a cosmetically appealing appearance by concealing the skirt 24 and plate 26. In one embodiment, the bezel 40 also includes an opening 77 for receiving an LED 78 or other visual indicator of the operational status of the fan. When the bezel 40 is mounted to the base 60, the bezel 40 is stationary with respect to the base 60 while the handle assembly 20 is rotatable with respect to the base 60 and the bezel 40.

Figure 3:
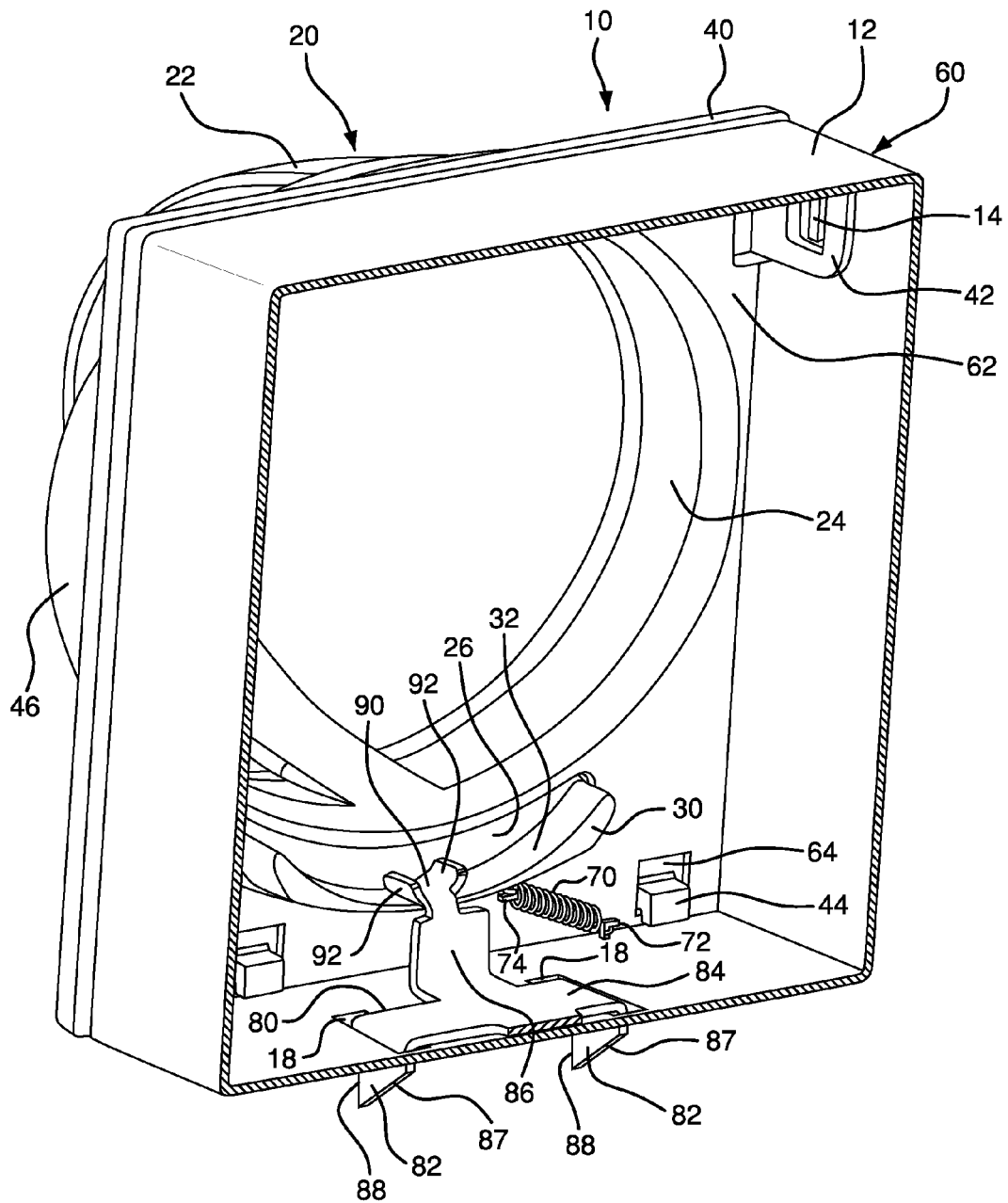
FIG. 3 is a cutaway rear perspective view showing an embodiment of a fan module latching device.

The base 60 comprises a frame 12 and a front plate 62. The frame 12 has an open front end that is partially enclosed by the front plate 62. The front plate 62 can be integrally formed with the frame 12 or can be secured to the frame 12 by any mechanism known to one skilled in the art. As depicted in FIGS. 1 and 3, the front plate 62 is integral with the frame 12. The frame 12 and the front plate 62 are preferably made from a material having sufficient rigidity to form a protective cover around the internal components of the fan module 100. In one embodiment, the frame 12 and front plate 62 are made from plastic. In another embodiment, the frame 12 and front plate 62 are made from aluminum. In another embodiment, the frame 12 and front plate 62 are made from different materials. In a fan module 100, the base 60 encloses a conventional fan (not shown), including such components as a motor driving a shaft-mounted blade. In a blank module 110, no components need be enclosed with the base 60 other than the latching device 10.

The bezel 40 can be secured to the base 60 by any mechanism known to one skilled in the art. As depicted in FIGS. 1 and 3, the bezel 40 comprises fittings 42 adapted pass through the front plate 62 and to engage mating fittings 14 on the frame 12, and the bezel 40 further comprises fittings 44 adapted to secure to mating openings 64 in the front plate 62. In one embodiment, as shown in FIG. 2, the front plate 62 includes a grill 66 to protect the fan from debris or from accidental user contact.

In the embodiment depicted in FIG. 1, the handle assembly 20 can be moved freely back and forth between the neutral position and the actuated position. A user can turn the handle 22 to rotate the handle assembly 20 from the neutral position to the actuated position, and to rotate the handle assembly 20 from the actuated position to the neutral position. In the embodiment depicted in FIG. 3, the handle assembly 20 is biased by a spring 70 to the neutral position, one end of the spring 70 being anchored to a hook 72 depending from the base 60 and an opposed end of the spring 70 being anchored to a hook 74 depending from the cam member 30. The spring 70 retains the handle assembly 20 in the neutral position and causes the handle assembly 20 to return from the actuated position to the neutral position after an actuating force has been removed. An actuating force is generally applied to the handle assembly 20 by the hand of a user turning the handle 22 in the direction indicated by the directional arrow 54 on the bezel trim ring 46.

The base 60 further comprises a fan module latch 80 mounted to the frame 12 in a manner that restrains the latch 80 from moving with respect to the frame 12 but allows a portion of the latch 80 to flex inwardly with respect to the frame 12. In one embodiment, the latch 80 is made from a substantially rigid but elastically resilient material such as stainless steel. In other embodiments, the latch can be made from other materials with similar properties of rigidity and resiliency, including but not limited to steel, aluminum, and plastic.

The module latch 80 comprises a plate 84 supporting at least one latching tab 82 depending therefrom, the plate 84 being disposed generally parallel to a side of the frame 12 and the tab 82 extending generally perpendicularly outwardly from the plate 84. In the embodiments shown in FIGS. 1-3, the latch plate 84 supports two latching tabs 82, it being understood that the module latch 80 would be operative with any number of latching tabs 82, including one tab 82 and three or more tabs 82. As depicted, the tabs 82 extend through apertures 18 in the frame 12 and protrude outwardly from the base 60. When the tabs 82 extend beyond the base 60, the tabs 82 are adapted to engage respective mating fixtures (not shown) in the enclosure 200 to secure the fan module 100 in the enclosure 200.

Figure 4:
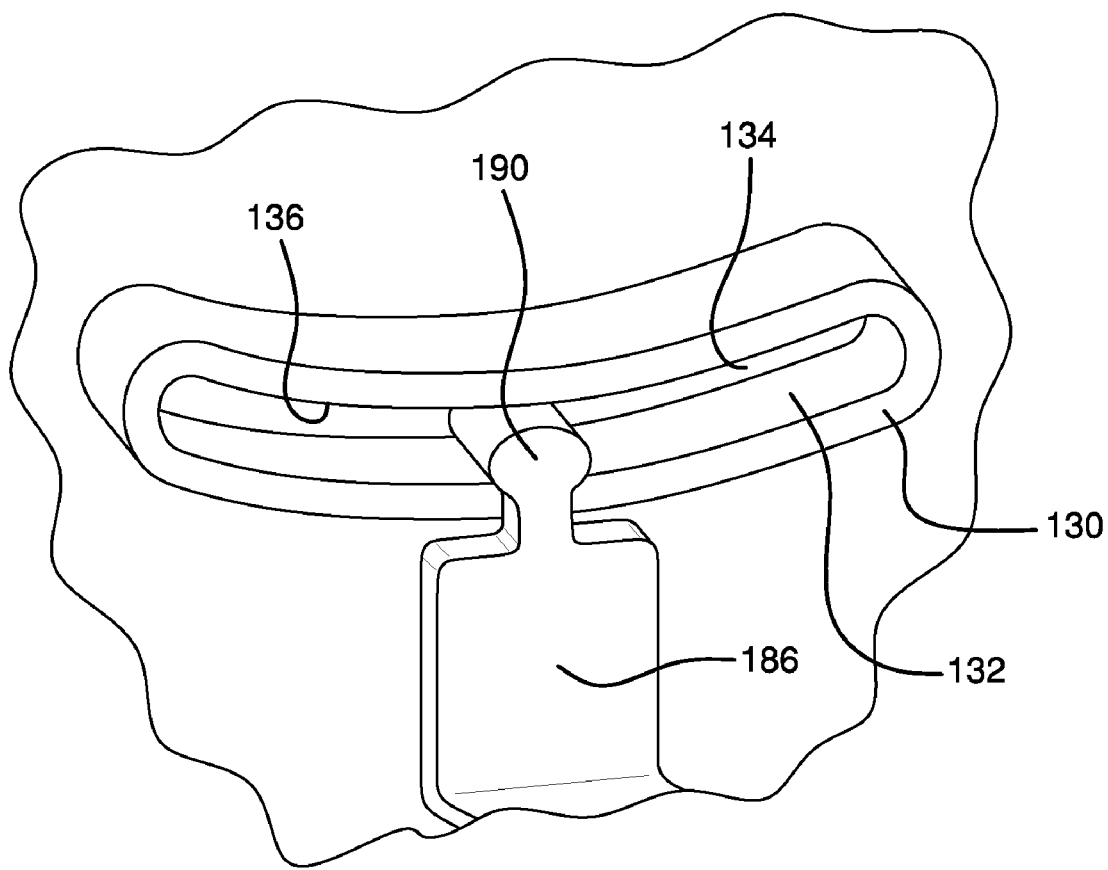
FIG. 4 is a cutaway partial rear perspective showing an embodiment of a cam member and cam follower.

Each latching tab 82 has a generally triangular shape and includes a generally sloped rear face 87 to allow the fan module 120 to be readily inserted into an opening 202 in the enclosure 200, the face 87 enabling an edge 204 of the enclosure opening 202 to cause the latching tab 82 be retracted inwardly with respect to the frame 12 as the fan module 120 is pushed in a rearward direction. (Note that for an embodiment without a biasing spring 70, as shown in FIG. 1, in combination with a cam slot 134, as shown in FIG. 4, the retraction of the tab 82 will cause the handle assembly 20 to rotate from the neutral position toward the actuated position.) Each latching tab 82 further includes a front face 88 disposed generally perpendicularly to the frame 12 to prevent the fan module 120 from being removed from the enclosure opening 202 without retracting the tab 82 inwardly with respect to the base 60.

The module latch 80 further comprises a member 86 extending generally perpendicularly inwardly from the plate 84 toward the interior of the fan module 100. The member 86 supports a cam follower 90 adapted to engage the cam surface 32 of the cam member 30. As depicted in the embodiments of FIGS. 1 and 3, the cam follower 90 has a generally curved shape to facilitate smooth engagement between the cam follower 90 and a cam surface 32, as the cam member 30 is rotated along with the handle assembly 20.

When the handle assembly 20 is assembled to the base 60, the cam follower 90 of the module latch 80 engages the cam surface 32 of the cam 30. For locking the fan module 100 within the enclosure 200, the handle assembly 20 is placed in a neutral position, indicated by alignment of the mark 58 on the handle 22 with the locked indicator 50 on the bezel trim ring 46. When the handle assembly 20 is in the neutral position, the cam follower 90 resides at a location on the cam surface 32 such that the latching tabs 82 extend outwardly from the frame 12 for securing the fan module 100 in the enclosure 200. In one embodiment, the handle assembly 20 can be manually moved to the neutral position. In another embodiment, the spring 70 biases the handle assembly 20 to the neutral position such that the spring 70 is neither extended nor compressed, or is slightly extended, when the handle assembly 20 is in the neutral position. Use of the spring 70 ensures that the handle assembly 20 returns to the neutral position so that the latching tabs 82 are extended and the fan module 100 is secured within the enclosure 200.

When the handle assembly 20 is rotated toward the actuated position, the spring 70 becomes further extended. As the handle assembly 20 is rotated with respect to the base 60 from the neutral position to the actuated position by rotating the handle 22 in the direction of rotation indicated by the arrow 54 on trim ring 46, the cam surface 32 exerts inward force on the cam follower 90, pulling the module latch 80 toward the interior of the fan module 100, thereby causing the latching tabs 82 to retract inwardly with respect to the base 60. When the handle assembly 20 is rotated to the actuated position where the mark 58 on the handle 22 is aligned with an unlocked indicator 52 on the bezel trim ring 46, the latching tabs 82 are full retracted (i.e.; the latching tabs 82 do not extend outwardly beyond the frame 12), thus permitting the fan module 100 to be removed from the enclosure 200 by exerting a pulling force on the handle 22.

In one embodiment, the module latch 80 is affixed to the frame 12 so as to flex when the handle assembly 20 is rotated by an actuating force from the neutral position to the actuated position, the module latch returning by its own elastic resiliency when the handle assembly 20 is urged to return to the neutral position from the actuated position. In this manner, the cam follower 90 remains continually engaged and in contact with the cam surface 32 such that the movement of the cam follower 90 follows the movement of the cam surface 32 of the cam member 30. As the handle assembly 20 is turned, the cam follower 90 is gradually drawn inwardly, thereby gradually retracting the tabs 82 inwardly toward the base 60. In one embodiment, as depicted in FIG. 1, the handle assembly 20 is urged to return to the neutral position manually. In another embodiment, as depicted in FIG. 3, the handle assembly 20 is urged to return to the neutral position by the biasing force of the extended spring 70. The material of the module latch 80 is sufficient rigid such that movement of the cam follower 90 causes a corresponding and proportional movement of the latching tabs 82, yet sufficient resilient such that the latching tabs 82 can return spontaneously to a neutral outwardly extended position when the actuating force, as transmitted by the cam member 30, is removed.

In another embodiment, as shown in FIG. 4, the cam member 130 comprises a lower cam surface 132 and an upper cam surface 136 bounding a slot 134 adapted to receive a cam follower 190. When the handle assembly 20 is rotated from the neutral position to the actuated position, the cam follower 190 tracks the lower cam surface 132, thereby causing the latching tabs 82 to retract inwardly toward the base 60. When the handle assembly 20 is rotated from the actuated position to the neutral position, the cam follower 190 tracks the upper cam surface 136, thereby causing the latching tabs 82 to extend outwardly from the base 60. The handle assembly 20 may be returned to the neutral position either manually or by the biasing spring 70. In the embodiment of the cam member 30 and cam follower 90 depicted in FIG. 4, the module latch 80 need not have sufficient elastic resiliency to cause the cam follower 190 and tabs 82 to return to the neutral position on their own, because the upper cam surface 136 serves that purpose.

In sum, a fan module 100 comprising the latching device 10 can be replaced (i.e., installed into or removed from an opening 202 in an enclosure 200) as follows. In the neutral position, without the handle assembly 20 being actuated, the handle 22 is aligned with the locked indicator 50 on the bezel trim ring 46 and the latching tabs 82 extend outwardly from the base 60 of the fan module 100. To install the fan module 100, the rear portion 106 of the fan module 120 is inserted into the enclosure opening 202 until the latching tabs 82 reach the front of the enclosure 200. Due to the sloped faces 87 on the latching tabs 82, pushing the fan module 100 further into the enclosure 200 causes the tabs 82 to contact the edge 204 of the opening 202, and to thereby be retracted inwardly with respect to the base 60. Alternatively, the handle assembly 20 can be manually rotated in the direction of the arrow 54 to the actuated position, wherein the handle 22 is aligned with the unlocked indicator 52 on the bezel trim ring 46 and the tabs 82 are fully retracted. Once the fan module 100 is inserted to the desired depth, the tabs 82 are returned to the outwardly extended position, wherein the tabs 82 extend outwardly beyond the base 60 to engage latching fixtures (not shown) in the enclosure 200. The tabs 82 can be extended by manually rotating the handle assembly 20 from the actuated position to the neutral position. Alternatively, the tabs 82 can be extended automatically as the cam member 30 and handle assembly 20 are returned to the neutral position by the biasing spring 70. In one embodiment, the tabs 82 spring outwardly due to the elastic resiliency of the rigid but flexible module latch 80. In another embodiment, the tabs 82 spring outwardly due to the force applied by the upper cam surface 136 of the cam member 130 to the cam follower 90.

To remove the fan module 100 from the enclosure 200, the handle 22 is turned in the direction of the arrow 54 to be aligned with the unlocked indicator 52, thereby rotating the handle assembly 20 to the actuated position and causing the latching tabs 82 to be retracted inwardly with respect to the base 60. Subsequently or simultaneously, the handle 22 is pulled in a frontward direction with respect to the enclosure 200, such that as soon as the tabs 82 disengage from the enclosure 200, the fan module 100 can be drawn frontwardly out from the enclosure 200. Once the fan module 100 has been withdrawn beyond the position where the tabs 82 are external to the enclosure 200, the handle assembly 20 can be returned, or allowed to return, to the neutral position without impeding further withdrawal of the fan module 100.

What is claimed is:

1. In a fan module having a base for enclosing a fan, a fan module latching device comprising:
   a handle assembly rotatably supported by the base, the handle assembly comprising a rearwardly depending cam member and a frontwardly extending handle for actuating the handle assembly between a neutral position and an actuated position;
   a module latch attached to the base, the module latch comprising a cam follower and at least one latching tab, the cam follower engaging the cam member such that when the handle assembly is in the neutral position the latching tab is extended outwardly with respect to the base and when the handle assembly is in the actuated position the latching tab is retracted inwardly with respect to the base.

2. The latching device of claim 1, further comprising a biasing spring interconnecting between the base and the handle assembly for biasing the handle assembly in the neutral position.

3. The latching device of claim 2, wherein one end of the spring is attached to the handle assembly and an opposed end of the spring attached to the base.

4. The latching device of claim 1, the handle assembly further comprising an annular skirt interconnecting between the cam member and the handle.

5. The latching device of claim 4, wherein the handle is a generally U-shaped handle attached to the skirt at diametrically opposed locations.

6. The latching device of claim 1, the latching tab having a rear face generally sloped with respect to the base and a front face generally perpendicular to the base.

7. The latching device of claim 1, wherein the module latch is made from a material having sufficient rigidity to cause the latching tab to retract when the handle assembly is in the actuated position and sufficient resiliency to the cause the latching tab to extend outwardly when the handle assembly is returned to the neutral position.

8. The latching device of claim 1, the cam member comprising a slot for receiving the cam follower such that the slot engages the cam follower, causing the latching tab to move from retracted to outwardly extended when the handle is rotated from the actuated position to the neutral position.

9. The latching device of claim 1, the base comprising a frame and a front plate, the frame enclosing a fan and having a generally open front end, and the front plate attaching to the frame for partially enclosing the front end of the frame.

10. A fan module adapted for removable mounting in an enclosure opening, comprising:
- a base enclosing a fan, the base comprising a module latch having a cam follower and at least one latching tab;
- a bezel; and
- a handle assembly rotatably retained between the bezel and the base, the handle assembly having frontwardly extending handle and a rearwardly depending cam member for engaging the cam follower such that when the handle assembly is a neutral position the latching tab extends outwardly from the base for securing the fan module within the enclosure opening and when the handle assembly is in an actuated position the latching tab is retracted inwardly toward the base to enable removal of the fan module from the enclosure opening.

11. The fan module of claim 10, further comprising a biasing spring interconnecting between the base and the handle assembly for biasing the handle assembly in the neutral position.

12. The fan module of claim 10, the latching tab having a rear face generally sloped with respect to the base and a front face generally perpendicular to the base.

13. The fan module of claim 10, the handle assembly further comprising an annular skirt interconnecting between the cam member and the handle.

14. A method of replacing a fan module in an enclosure, the fan module comprising a base, a bezel, and a handle assembly rotatably retained between the base and the bezel:
- determining whether the fan module is installed in the enclosure;
- when the fan module is determined to be installed in the enclosure, removing the fan module from the enclosure by:
  - causing one or more latching tabs to disengage from the enclosure; and
  - exerting frontward force on the fan module to withdraw the fan module from the enclosure; and
- when the fan module is determined not to be installed in the enclosure, installing the fan module into the enclosure by:
  - inserting a rear portion of the fan module into the enclosure and causing the fan module to move rearwardly with respect to the enclosure;
  - causing one or more latching tabs to retract inwardly with respect to the base as the fan module is further inserted into the enclosure; and
  - causing the latching tabs to extend outwardly from the base for engaging with the enclosure to prevent removal of the fan module from the enclosure.

15. The method of claim 14, wherein the step of causing one or more latching tabs to disengage from the enclosure and the step of exerting outward force on the fan module to withdraw the fan module from the enclosure occur substantially simultaneously.

16. The method of claim 14, wherein the step of causing one or more latching tabs to disengage from the enclosure comprises rotating the handle assembly with respect to the base from a neutral position to an actuated position whereby a cam member depending from the handle assembly engages a cam follower attached to the latching tabs to cause the latching tabs to retract inwardly with respect to the base.

17. The method of claim 14, wherein the step of causing one or more latching tabs to retract inwardly comprises applying rearward force to the fan module when sloped rear surfaces of the latching tabs contact the enclosure thereby causing the tabs to retract.

18. The method of claim 14, wherein the step of allowing the latching tabs to extend outwardly comprises allowing the handle assembly to return under force of a spring from the actuated position to a neutral position whereby the cam follower engages the cam member to cause the latching tabs to retract.

19. The method of claim 18, wherein the module latch is made from a material having sufficient rigidity to cause the latching tab to retract when the handle assembly is in the actuated position and sufficient resiliency to the cause the latching tab to extend outwardly when the handle assembly is returned to the neutral position.

20. The method of claim 14, wherein the step of causing one or more latching tabs to retract comprises rotating the handle assembly with respect to the base from a neutral position to an actuated position whereby a cam member attached to the handle assembly engages a cam follower attached to the latching tabs to cause the latching tabs to retract.

* * * * *

UNITED STATES PATENT AND TRADEMARK OFFICE
CERTIFICATE OF CORRECTION

PATENT NO. : 8,202,047 B2  
APPLICATION NO. : 12/116601  
DATED : June 19, 2012  
INVENTOR(S) : John P. Franz et al.

Page 1 of 1

It is certified that error appears in the above-identified patent and that said Letters Patent is hereby corrected as shown below:

In column 6, line 58, in Claim 7, after "to" delete "the".

In column 8, line 34, in Claim 19, after "to" delete "the".

Signed and Sealed this  
Twelfth Day of March, 2013

Teresa Stanek Rea  
*Acting Director of the United States Patent and Trademark Office*